US006942731B2

(12) United States Patent
Sellin et al.

(10) Patent No.: US 6,942,731 B2
(45) Date of Patent: Sep. 13, 2005

(54) METHOD FOR IMPROVING THE EFFICIENCY OF EPITAXIALLY PRODUCED QUANTUM DOT SEMICONDUCTOR COMPONENTS

(75) Inventors: Roman Sellin, Berlin (DE); Nikolai N. Ledenstov, Berlin (DE); Dieter Bimberg, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 0 days.

(21) Appl. No.: 10/363,031

(22) PCT Filed: Aug. 30, 2001

(86) PCT No.: PCT/EP01/10015

§ 371 (c)(1),
(2), (4) Date: Aug. 18, 2003

(87) PCT Pub. No.: WO02/19402

PCT Pub. Date: Mar. 7, 2002

(65) Prior Publication Data

US 2004/0020424 A1 Feb. 5, 2004

(30) Foreign Application Priority Data

Aug. 30, 2000  (DE) .......................................... 100 44 040

(51) Int. Cl.$^7$ .............................................. C30B 25/04
(52) U.S. Cl. ............................ 117/89; 117/50; 117/94; 117/95; 117/101; 117/102; 117/104
(58) Field of Search .............................. 117/89, 90, 94, 117/95, 101, 102, 104

(56) References Cited

U.S. PATENT DOCUMENTS

| | | | | |
|---|---|---|---|---|
| 5,244,828 A | * | 9/1993 | Okada et al. ............... | 438/479 |
| 5,614,435 A | | 3/1997 | Krishnamurhty et al. | |
| 5,643,828 A | * | 7/1997 | Ugajin et al. ............... | 438/494 |
| 6,242,326 B1 | * | 6/2001 | Ro et al. ..................... | 438/493 |
| 6,372,536 B1 | * | 4/2002 | Fischer et al. ............... | 438/46 |

FOREIGN PATENT DOCUMENTS

| | | |
|---|---|---|
| DE | 198 19 259 A | 11/1999 |
| WO | WO 90 03659 A | 4/1990 |
| WO | WO 01 17035 A | 3/2001 |

OTHER PUBLICATIONS

R.L. Sellin, et al., Close–to–ideal device characteristics of high–power InGaAs/GaAs quantom dot lasers, Applied Physics Letters, vol. 78, No. 9, Feb. 26, 2001, pp 1207–1209, © 2001 American Institute of Physics, http://ojps.alp.org/aplo/aplcpyrts.html.

Y. Arakawa, et al., Multidimensional quantum well laser and temperature dependence of its threshold current, Applied Physics Letters, vol. 40, No. 11, Jun. 1, 1982, pp 939–941, © 1982 American Institute of Physics, http://apl.aip.org/apl/copyright.jsp.

Masahiro Asada, et al., Gain and the Threshold of Three–Dimensional Quantum–Box Lasers, IEEE Journal of Quantum Electronics, vol. QE–22, No. 9, Sep. 1986, pp 1915–1921, © 1986 IEEE.

Yasuyuki Miyamaoto, et al., Light Emission from Quantum–Box Structure by Current Injection, Japanese Journal of Applied Physics, vol. 26, No. 4, Apr. 1987, pp. L225–L227.

F. Heinrichsdorff, et al., Influence of In/Ga intermixing on the optical properties of InGaAs/GaAs quantum dots, Journal of Crystal Growth 195 (1998), pp 540–545, © 1998 Elsevier Science B.V.

Marius Grundmann, et al., Progress in Quantum Dot Lasers; 1100 nm, 1300 nm, and High Power Applications, Japanese Journal of Applied Physics, vol. 39 (2000), pp 2341–2343, Part 1, No. 4B, Apr. 2000, © 2000 The Japan Society of Applied Physics.

Marius Grundmann, The present status of quantum dot lasers, Physica E. 5 (2000), pp 167–184, © 2000 Elsevier Science B.V., www.elsevier.nl/locate/physe.

C.V. Reddy, et al., Nature of the bulk defects in GaAs through high–temperature quenching studies, Physical Review B, vol. 54, No. 16, Oct. 15, 1996–II, © 1996 The American Physical Society, pp. 11290–11297.

V.A. Shchukin, et al., Spontaneous Ordering of Arrays of Coherent Strained Islands, Physical Review Letters, vol. 75, No. 16, pp 2968–2971, Oct. 16, 1995, © 1995 The American Physical Society.

(Continued)

*Primary Examiner*—Robert Kunemund
(74) *Attorney, Agent, or Firm*—Rothwell, Figg, Ernst & Manbeck, P.C.

(57) ABSTRACT

The invention relates to a method for improving the efficiency of epitaxially grown quantum dot semiconductor components having at least one quantum dot layer. The efficiency of semiconductor components containing an active medium consisting of quantum dots is often significantly below the theoretically possible values. The inventive method enables the efficiency of the relevant component to be clearly increased without substantially changing the growth parameters of the various epitaxial layers. In order to improve the efficiency of the component, the crystal is morphologically changed when the growth of the component is interrupted at the point in the overall process at which the quantum dots of a layer have just been covered. The growth front is smoothed at the same time, leading to, for example, a reduction in waveguide loss as the thickness of the waveguide is more homogeneous if the relevant component has one such waveguide. Simultaneously, smoothing the growth front enables the quantum dot layers to be stacked closer together than before, thereby increasing the volume filling factor. The modal gain is thus increased, for example for lasers or amplifiers.

12 Claims, No Drawings

OTHER PUBLICATIONS

N.N. Ledentsov, et al., Ordered Arrays of the Quantum Dots: Formation Electronic Spectra, Relaxation Phenomena, Lasing, Solid–State Electronics, vol. 40, Nos. 1–8, pp 785–798, 1996, Copyright © 1996 Elsevier Science Ltd., Printed in Great Britain.

N. N. Ledentsov, et al., 1.3 μm luminescence and gain from defect–free InGaAs–GaAs quantum dots grown by metal–organic chemical vapour deposition, Semicond. Sci. Technol. 15, (2000), pp 604–607, Printed in the UK, © IOP Publishing Ltd.

F. Heinrichsdorff, et al., High–power quantum–dot lasers at 1100 nm, Applied Physics Letters, vol. 76, No. 5, pp. 556–558, Jan. 31, 2000, © 2000 American Institute of Physics.

M. M. Sobolev, et al., Thermal Annealing of Defects in InGaAs/GaAs Heterostructures with Three–Dimensional Islands, Semiconductors, vol. 34, No. 2, 2000, pp 195–204, Translated from Fizika i Tekhnika Poluprovodnikov, vol. 34, No. 2, 2000, pp 200–210, Original Russian Text Copyright © 2000 by Sobolev, Kochnev, Lantratov, Bert, Cherkashin, Ledentsov, Bedarev.

* cited by examiner

METHOD FOR IMPROVING THE EFFICIENCY OF EPITAXIALLY PRODUCED QUANTUM DOT SEMICONDUCTOR COMPONENTS

CROSS REFERENCE TO RELATED APPLICATION

This application is a 35 USC 371 National Phase Entry Application from PCT/EP01/10015, filed Aug. 30, 2001, and designating the U.S.

This invention relates to a method of improving the efficiency of epitaxially produced quantum dot semiconductor components according to the preamble of patent Claim 1.

Quantum dot (QD) components of semiconductor materials, e.g., laser diodes, amplifiers, modulators or photodetectors in which the active zone consists of one or more QD layers, have been produced and investigated worldwide for several years. In the 1980s, for example, reduced threshold current densities, increased characteristic temperatures, increased gain and differential gain were predicted for semiconductor laser diodes using QDs as the gain medium [Y. Arakawa et al., *Appl. Phys. Lett.* 40, 939 (1982); M. Asada et al., *IEEE J. Quant. Electr.* QE-22, 1915 (1986)]. In contrast with components such as QF LEDs or QF laser diodes (LDs), which have been available commercially for some time now, QD components are still in the stage of research and development.

Since the first use of QDs in a component, namely as an active medium in an InGaAsP/InP LED [Y. Miyamoto et al., *Jpn. J. Appl. Phys.* 26, L225 (1987)], production of QDs has become controllable to the extent that laser diodes are currently being optimized for specific applications such as use in optoelectronic data transmission or as high-performance infrared lasers [F. Heinrichsdorff et al., *Appl. Phys. Lett.* 76, 556 (2000); M. Grundmann et al., *Jpn. J. Appl. Phys.* 39, 2341 (2000); M. Grundmann, *Physica E* 5,167 (2000)].

In epitaxial growth of QD components, it is not readily possible for each epitaxial layer to be deposited at the ideal temperature for that particular material. At the optimum growth temperature of each layer, formation of dislocations could be largely prevented and the concentration of dot defects could be minimized. Dislocations and dot defects are disturbances in the periodicity of the crystal lattice and have high inclusion potentials for charge carriers. For example, in arsenic-rich growth of GaAs, e.g., in MOCVD or in MBE, primarily $As_{Ga}$ and $As_{Si}$ defects are generated and interact with one another, producing the deep electronic defect EL2 [G. B. Stringfellow, *Organometallic Vapor-Phase Epitaxy; Theory and Practice,* Academic Press, Inc. (1989); C. V. Reddy et al., *Phys. Rev. B* 54, 11290 (1996)]. Electrons and holes localized there recombine in general in a nonradiant process. Such nonradiant recombination processes may be predominant over the radiant recombination processes in the case of high defect concentrations and lead to a low efficiency or even death of the respective component.

However, optimum temperatures for growth of layers above the QDs can promote diffusion and segregation effects in the QDs such that their physical properties are influenced negatively, resulting in a reduction of their inclusion potentials or even structural destruction. For example, in the Stranski-Krastanow growth mode (U.S. Pat. No. 5,614,435) the QDs are typically deposited at temperatures far below the ideal growth temperature of the barrier materials above them. Before the reactor temperature is raised again after growth of the QDs, the QDs must first be overgrown to stabilize the QD ensemble against a thermodynamically induced restructuring and thermally promoted formation of dislocations (see below). Premature heating of the sample would destroy the QDs. Therefore, some of the cover material must be deposited at a temperature below its ideal growth temperature.

Apart from low growth temperatures as the cause of development of defects, formation of the QDs themselves may constitute a source of defects. In the above-mentioned Stranski-Krastanow (SK) growth mode, for example, the QD semiconductor material has a higher lattice constant than the substrate on which the QD semiconductor material is deposited. The material strain resulting from the lattice mismatching is the driving force for the creation of quantum dots. In doing so, the material of the strain yields by contracting to form 3D islands which undergo elastic relaxation in the direction of growth. For a given material system, the density and size of the 3D islands have stable equilibrium values [V. A. Shchukin et al., *Phys. Rev. Lett.* 75, 2968 (1995); N. N. Ledentsov et al., *Sol. St. Electr.* 40, 78 (1996)]. Due to the kinetic effects or due to excessively high strain energies, the material may additionally dissipate the strains due to the formation of individual dislocations or even clusters of dislocations, which are completely relaxed.

The object of this invention is to provide a method with which a definite improvement in the efficiency of epitaxially produced quantum dot semiconductor elements is possible by reducing electric losses and optical scattering losses.

This object is achieved with the characterizing features of patent claim 1.

Advantageous further embodiments are characterized in the subclaims.

The efficiency of components is significantly improved by the method according to this invention due to the fact that defects which are form ed in the growth of the quantum dots or in overgrowing them with barrier material at low temperatures undergo healing processes during the interruption in growth. Voids can be destroyed [N. N. Ledentsov et al., *Sol. St. Electr.* 40, 78 (1996)] and interstitial atoms may be desorbed in the process if they reach the surface through diffusion.

Dislocation lines may grow out, as long as they do not extend too far into the sample. It is therefore important for the QDs to be as close to the surface as possible during the interruption in growth.

According to the further embodiment of claim 2, the temperature during the growth interruption is higher than the growth temperature of the QDs. Therefore, the healing processes described above are thermally stimulated. In addition, the evaporation of dislocation clusters that have formed in the QD layer can be induced [N. N. Ledentsov et al., *Semicond. Sci. Technol.* 15, 604 (2000)]. This is possible if the clusters protrude above the level of the QD because of their size and the QD material of which the dislocation clusters are also composed is unstable with respect to desorption at the temperature and duration of the growth interruption.

The inventive process results in an increased efficiency of QD components due to the reduction in lattice defects and thus a reduction in electric losses.

In addition, the further embodiments according to claims 3 through 10 result in an increased efficiency of optoelectronic components due to the reduction in scattering losses of the optical wave at corrugated heterojunctions between materials of different refractive indices. Such corrugations may be a few nanometers high [F. Heinrichsdorff et al., *J. Cryst. Growth* 195, 540 (1998), FIG. 1(*a*)] and may have different periods in the different directions of the growth plane. They are formed when QDs are overgrown at low temperatures. During the interruption in growth according to this invention, there is a redistribution of the cover layer material, which results in smoothing of the surface. Depending on the faulty orientation of the substrate, the growth interruption also causes the restoration of a monolayer terrace structure.

According to the further embodiment of claim 11, restoration of the monolayer surface morphology of the QD cover layer makes it possible to deposit an additional layer of QDs directly on the cover layer. The deposition of QD material in the SK growth mode on corrugated surfaces results in a large number of dislocations being formed at the expense of the QD density. The embodiment according to claim 12 precludes this case. This means that the QD density of the following QD layer is comparable to the density of the preceding layer if both layers have been deposited under otherwise identical growth conditions.

In addition to the advantages offered by the inventive method for the efficiency of QD components, production of QD components, e.g., in the SK mode without the method described here would require the discovery of a narrow window of epitaxial parameters within which the process must be stabilized. Outside of this window, the production of quantum dots suitable for components would no longer be possible. This parameter window is much smaller than that in epitaxy of QF components. Therefore, the stability requirements of industrial epitaxial processes for production of QD components are extraordinarily high. These requirements can be greatly limited through the use of the method described here, because the defect reduction described here makes it possible to produce QDs suitable for components at the edge or even outside of the parameter window described above.

ABBREVIATIONS USED:

| | |
|---|---|
| $As_{Ga}$ | A dot defect in GaAs: one atom of arsenic is located at the site of a Ga atom in the group III sublattice |
| $As_{Si}$ | A dot defect: one atom of arsenic is located on at interstitial site |
| DLTS | Deep level transient spectroscopy |
| GaAs | Gallium arsenide |
| InGaAs | Indium-gallium arsenide |
| InGaAsP | Gallium-indium arsenide phosphide |
| InP | Indium phosphide |
| LD | Laser diode |
| LED | Light-emitting diode |
| MBE | Molecular beam epitaxy |
| MOCVD | Metalorganic chemical vapor deposition |
| OF | Surface area |
| QF | Quantum film(s) (n) |
| QD | Quantum dot(s) (n) |

We claim:

1. A method for improving the efficiency of epitaxially produced quantum dot semiconductor components having at least one quantum dot layer, comprising the step of interrupting growth of the semiconductor component each time after a layer of coherent quantum dots has been overgrown with a layer of semiconductor material at least thick enough to completely cover all the quantum dots, wherein the step of interrupting growth of the semiconductor component is carried out for each quantum dot layer.

2. Method according to claim 1, characterized in that the substrate temperature during the growth interruption is higher than the temperature at which the quantum dot material was deposited.

3. Method according to claim 1, characterized in that the semiconductor component is an optoelectronic component.

4. Method according to claim 1, characterized in that the semiconductor component contains a waveguide.

5. Method according to claim 1, characterized in that the semiconductor component is a laser.

6. Method according to claim 1, characterized in that the semiconductor component is an amplifier.

7. Method according to claim 1, characterized in that the semiconductor component is a modulator.

8. Method according to claim 1, characterized in that semiconductor component is a photodetector.

9. Method according to claim 1, characterized in that the growth front is smoothed during the growth interruption.

10. Method according to claim 1, characterized in that the waveguide losses are reduced.

11. Method according to claim 1, characterized in that in the case of a multiple stack of quantum dot layers, a subsequent QD layer is deposited immediately after the growth interruption described in claim 1.

12. Method according to claim 11, characterized in that the surface density of QD of a following layer is no smaller than the QD density in the preceding QD layer due to the formation of completely relaxed clusters of dislocations.

* * * * *

UNITED STATES PATENT AND TRADEMARK OFFICE
CERTIFICATE OF CORRECTION

| | | |
|---|---|---|
| PATENT NO. | : 6,942,731 B2 | Page 1 of 1 |
| APPLICATION NO. | : 10/363031 | |
| DATED | : September 13, 2005 | |
| INVENTOR(S) | : Roman Sellin et al. | |

It is certified that error appears in the above-identified patent and that said Letters Patent is hereby corrected as shown below:

On the Title Page
Item (75) Inventors: Please correct the spelling of the second inventor's name Nikolay LEDENTSOV

Signed and Sealed this
Fifteenth Day of November, 2011

David J. Kappos
*Director of the United States Patent and Trademark Office*